(12) United States Patent
Matsumoto

(10) Patent No.: US 6,410,902 B1
(45) Date of Patent: Jun. 25, 2002

(54) OPTICAL RECEIVER

(75) Inventor: Kazuya Matsumoto, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/214,405

(22) PCT Filed: Jun. 20, 1997

(86) PCT No.: PCT/JP97/02134

§ 371 (c)(1),
(2), (4) Date: Dec. 18, 1998

(87) PCT Pub. No.: WO97/49205

PCT Pub. Date: Dec. 24, 1997

(30) Foreign Application Priority Data

Jun. 20, 1996 (JP) .............................. 8-159574

(51) Int. Cl.⁷ ................................................ H01J 40/14
(52) U.S. Cl. .............................. 250/214 LA; 250/214 R
(58) Field of Search ....................... 250/214 LA, 214 A, 250/214.1, 214 R; 330/308, 59; 359/189

(56) References Cited

U.S. PATENT DOCUMENTS 5,517,035 A * 5/1996 Krijntjes ..................... 250/551

FOREIGN PATENT DOCUMENTS

| JP | 372 742 | 6/1990 |
|----|---------|--------|
| JP | 6-164253 | 6/1994 |
| JP | 6-216663 | 8/1994 |
| JP | 6-284090 | 10/1994 |
| JP | 6-291293 | 10/1994 |
| JP | 8-154079 | 6/1996 |

* cited by examiner

Primary Examiner—Que T. Le
(74) Attorney, Agent, or Firm—McDermott, Will & Emery

(57) ABSTRACT

In order to compensate for deterioration in gain caused by decreases in signal source impedance on a higher frequency region, a frequency characteristic compensating inductor is inserted between a light-receiving device and its bias power supply. The light-receiving device is connected to the bias power supply by way of the inductor. By causing the resonance frequency determined by the inductor and the parasitic capacitance and junction capacitance of device to coincide in the vicinity of the upper limit frequency of the band of the optical receiver, the equivalent signal source impedance of the light-receiving device can be enhanced, thus compensating for the decrease in gain of the receiver.

10 Claims, 4 Drawing Sheets

PD — MATCHING TRANSFORMER — PREAMP

OPTICAL RECEIVER

This application is the national phase of international application PCT/JP97/02134 filed Jun. 20, 1997 which designated the U.S.

TECHNICAL FIELD

The present invention relates to an optical receiver for receiving an optical signal and converting it into an electric signal and, in particular, to an optical receiver for receiving analog high-frequency optical signals used in CATV (cable television) and the like.

BACKGROUND ART

An optical receiver comprises a light-receiving device such as a photodiode (PD) which receives an optical signal and generates a corresponding current signal, and a preamplifier which converts this current signal into a voltage signal and amplifies the thus-converted signal to the amplitude required for a television receiver or the like connected downstream. As a results of increasing demand for a larger number of channels for CATV or the like, the frequency band which such an optical receiver can cover is extending into the higher frequency region and is presently approaching 1 GHz.

In order to treat such a high-frequency signal, impedance matching in any transmission system for transmitting the signal becomes quite important. In particular, when a signal is to be transmitted on a transmission line without impedance matching, the signal may be reflected at a point of impedance mismatch, thus causing noise or signal distortion, thereby degrading the reliability of transmission.

The above-mentioned impedance matching will now be studied in an optical receiver. The output impedance of a PD ranges from several hundred ohms to several thousand ohms in a frequency band of several tens of MHz to 1 GHz. On the other hand, it is difficult to design a preamplifier that is suitable for amplifying analog high-frequency signals with such a high input impedance. In general, an amplifier having an input impedance of 50 ohms or 75 ohms is employed, while the PD is terminated with a resistor of 50 ohms or 75 ohms, thus simulatively realizing impedance matching. This method, however, is unfavorable in terms of noise characteristics since the equivalent input noise of the amplifier is increased. Therefore, an impedance-matching transformer having a primary impedance of several hundred ohms and a secondary impedance of 50 ohms or 75 ohms is often inserted between the PD and the preamplifier. The preamplifier is connected to the secondary terminal of the matching transformer by way of an interstage coupling capacitor $C_c$.

Here, the matching transformer has a core made of a magnetic material having excellent high-frequency characteristics and is shaped like a torus, two windings are wound around the core, the number of the respective windings corresponding to the predetermined impedance values, and one end of one winding is connected to one end of the other winding. In general, the characteristics of a circuit in a frequency region as high as 1 GHz cannot be accurately determined unless parasitic capacitance of devices and circuit elements, their parasitic inductance, and the like are taken into consideration.

A PD is equivalently expressed by a current source $I_s$ supplying a current corresponding to an incident optical signal, junction capacitance $C_j$ of a semiconductor connected in parallel thereto, and a diffused resistor $R_j$ connected in series to a thus-formed parallel circuit. When a PD chip is assembled into a package, it is further necessary to take into account the parasitic inductance $L_s$ of the bonding wire connecting the PD chip to the lead pin of the package, and the parasitic capacitance $C_s$ formed between the lead pin and the outer lid of the package or the like. By so doing, the combined equivalent circuit of the PD and the package can be expressed in a lumped constant fashion. When a thin line having a diameter of several tens of micrometers is employed as a bonding wire, the wire has an inductance component of about 1 nH/mm. At a frequency of 1 GHz, this inductance component acts as an impedance of several ohms to several tens of ohms, which is on the same order of magnitude as that of the diffused resistor $R_j$ and thus cannot be neglected.

Assuming that the optical-to-electrical conversion efficiency of the PD and the gain of the preamplifier are free from frequency dependence, the optical signal transfer characteristic $V_o/I_s$ for such an equivalent circuit of an optical receiver in the lower frequency region is determined by the input impedance of the preamplifier and the interstage coupling capacitor $C_c$ connected between the preamplifier and the transformer. In the higher frequency region, on the other hand, parasitic elements of the PD, the inductance of the matching transformer, the parasitic capacitance between the windings, the loss in the transformer core, and the like have a complex relationship with the transfer characteristics. As a consequence, the gain in the transfer characteristic begins to decay gradually at about 100 MHz, such that, at 1 GHz, it is as much as 7 to 8 dB weaker than in the smaller frequency region.

In order to compensate for the above-mentioned decrease in the higher frequency region, the conventional method as disclosed, for example, in European Patent Application Laid-Open No. 372,742, has been to insert a frequency characteristic correcting coil $L_c$ between the PD and the matching transformer. This $L_c$ causes blunt resonance to occur with respect to the circuit element $C_j$, $C_s$, or the parasitic capacitance of the matching transformer. It has consequently been effective in increasing the gain in the band of several hundred MHz. However, in order for this method to increase the gain in a frequency region as high as about 1 GHz so as to flatten its band characteristic, it has been necessary to set the junction capacitance $C_j$ of the PD, its parasitic capacitance $C_s$, the parasitic capacitance of the matching transformer, and the like to very small values.

It has consequently been necessary to employ a high-cost packaging method in which, for example, the PD chip is mounted on a ceramic chip carrier, or in which an air core coil is employed as the frequency characteristic compensating coil $L_c$, so as to reduce the parasitic capacitance. But when using a PD package which can be aligned easily with or fixed to an optical fiber, or when using ordinary components such as transformers or coils that can be surface-mounted, it has only been possible to achieve a band width of 600 MHz or lower, thus failing to match a band width of 700 MHz or higher used in optical CATV.

DISCLOSURE OF THE INVENTION

Therefore, it is an object of the present invention to improve high-frequency characteristics of optical receivers by use of circuit technique without the aid of solutions such as the use of special packages and improvement, in high-frequency characteristics, of the above light-receiving devices themselves.

The optical receiver in accordance with the present invention comprises a light-receiving device, having one terminal coupled to a bias power supply, for converting an optical input signal into an electric signal; a preamplifier, coupled to the other terminal of the light-receiving device, for amplifying the electric signal; and an impedance-matching transformer, electrically coupled to the light-receiving device and the preamplifier, having a primary impedance matching the output impedance of the light-receiving device and a secondary impedance matching the input impedance of the preamplifier. In order to overcome the above-mentioned problems, the light receiving device further comprises a first frequency characteristic compensating circuit is coupled between the bias power supply and one terminal of the light-receiving device. The first circuit that compensates frequency characteristics comprises an inductance component to compensate the frequency characteristic. When the above-mentioned frequency characteristic compensating circuit is thus coupled between the PD bias power supply terminal and the bias power supply, the gain near the upper limit of the band can be enhanced without losing its middle to low frequency characteristics.

BRIEF DESCRIPTION OF THE DRAWINGS

The present invention will be easily understood from the accompanying drawings and the detailed explanation described hereinafter wherein.

BEST MODES FOR CARRYING OUT THE INVENTION

In the following, specific examples of the present invention and its principle will be explained with reference to embodiments.

Figure 1:
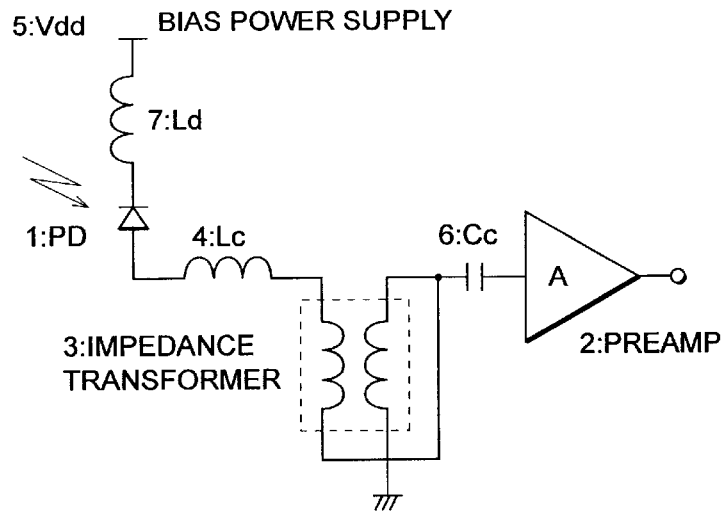
FIG. 1 is a circuit diagram that shows a circuit connection in an optical receiver in accordance with the present invention.

FIG. 1 is a circuit diagram showing a receiving circuit of an optical receiver in accordance with the present invention. This optical receiver comprises a light-receiving device PD 1 that has one terminal electrically connected to a bias power supply 5 and that receives an optical signal and supplies a current corresponding thereto; a preamplifier circuit 2 that receives an electric signal from PD 1 and amplifies this electric signal; and an impedance-matching transformer 3 that has a primary side electrically connected to the other terminal of PD 1 and a secondary side electrically connected to an input of preamplifier circuit 2.

Transformer 3 has a primary side impedance matching to the output impedance of PD 1 and a secondary side impedance matching to the input impedance of preamplifier circuit 2. In FIG. 1, the output of matching transformer 3 is connected to the input of preamplifier 2 by way of an interstage coupling capacitor $C_c$ 6 to block DC voltage. Preamplifier 2 converts the current from PD 1 into voltage, and amplifies the resulting signal to a magnitude necessary for a circuit connected downstream thereof. The input of matching transformer 3 is connected to one terminal of a second circuit 4 for compensating frequency characteristics which will be explained later. In this embodiment, for example, a commercially available video amplifier having an input impedance of 75 ohms and a band width of 50 MHz to 850 MHz can be used.

Also, this optical receiver comprises a first frequency characteristic compensating circuit 7 coupled between power supply 5 and PD 1. First circuit 7 that compensates frequency characteristics, having two terminals and an inductance element coupled between these terminals as an equivalent impedance, is electrically connected between bias power supply 5 and one terminal of PD 1. The circuit 7 for compensating frequency characteristics enhances the equivalent signal source impedance, and enhances the gain of the optical receiving circuit near the upper limit of the bandwidth without losing its middle to low frequency characteristics. In FIG. 1, a frequency characteristic compensating coil $L_d$ 7 is provided as an inductance element, and one terminal of coil 7 is connected to power supply 5. The other terminal is connected to one terminal of PD 1.

The optical receiver further comprises second frequency characteristic compensating circuit 4 coupled between PD1 and transformer 3. Second circuit 4 that compensates frequency characteristic, having two terminals and an inductance element coupled between these terminals as an equivalent impedance, is electrically connected between the primary terminal of transformer 3 and the other terminal of PD 1, thereby compensating in gain near the high frequency range without losing its middle to low frequency characteristics. In FIG. 1, a frequency characteristic compensating coil $L_c$ 4 is provided as the inductance element, and one terminal of coil 4 is connected to the primary terminal of transformer 3. The other terminal is connected to the other terminal of PD 1.

Employed as PD 1 is a PIN photodiode mainly composed of GaInAs that is sensitive in a wavelength band of 1.3 μm or 1.55 μm used in optical CATV and has an excellent high-speed response, sealed in a typical TO type package. The parasitic capacitance $C_s$ of this element and the parasitic inductance $L_s$ of its bonding wire or the like is estimated to be about 0.4 pF and about 2 nH, respectively. The resistance and capacitance values of the diffused resistor $R_j$ and the junction capacitance $C_j$ are about 10 ohms and 0.5 pF, respectively although they depend on the bias condition of the diode.

The matching transformer 3 has a core that is made of magnetic material with excellent high-frequency characteristics and is shaped like a torus or a figure eight. The number of turns in the two conductor lines wound around the core correspond to the predetermined impedance values, and one end of one winding is connected to one end of the other winding, thereby attaining predetermined impedance values on the primary and secondary sides respectively. In this embodiment, the core material is NiZn (ferrite), formed into the shape of a figure eight. The two conductor lines are wound four turns each, respectively, for the primary and secondary sides. As a consequence of the shape and windings, this transformer has impedance of 300 ohms and 75 ohms on the primary and secondary sides, respectively.

Figure 2:
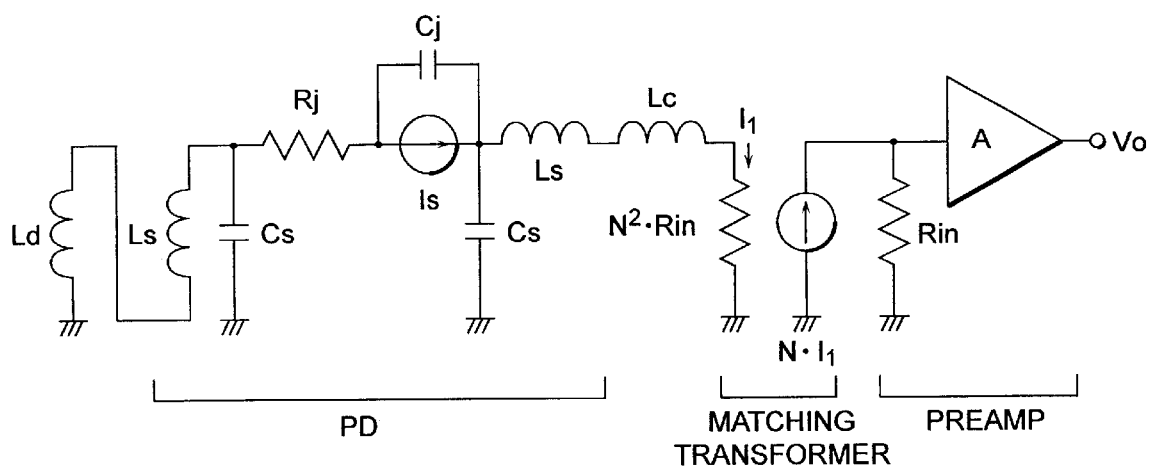
FIG. 2 is an equivalent circuit diagram of the optical receiver in accordance with the present invention that takes into account parasitic elements, which are expressed as a lumped constant fashion.

FIG. 2 is an equivalent circuit of the optical receiver shown in FIG. 1. When necessary in the following expressions, multiplication and division will be represented by "·" and "/", respectively.

Preamplifier 2 is equivalently expressed as an amplifier with a gain A and an input impedance of $R_{in}$. Assuming matching transformer 3 to be an ideal transformer in the band taken into consideration in the following analysis, its primary and secondary sides are equivalently expressed as a pure resistor of $N^2 \cdot R_{in}$ and a current source supplying a current N times the current $I_1$ flowing through the primary side (N being the turns ratio between the primary and secondary sides), respectively.

PD 1 is equivalently expressed by a current source $I_s$ supplying a current corresponding to an input optical signal, junction capacitance $C_j$ of a semiconductor connected in parallel thereto, and a diffused resistor $R_j$ connected in series to the parallel circuit. If a PD chip is assembled into a package, it is further necessary to take into account the parasitic inductance $L_s$ of the bonding wire connecting the PD chip and the lead pin of the package together, and the parasitic capacitance $C_s$ formed between the lead pin and the outer lid of the package or the like. By taking these factors into account, the equivalent circuit as combining the PD and the package can be expressed in a lumped constant fashion. Namely, this equivalent circuit is represented by connecting the inductance $L_s$ and the parasitic capacitance $C_s$ at each terminal of the equivalent circuit of the PD.

One terminal of PD 1 is connected to bias power supply $V_{dd}$ 5 by way of coil $L_d$ 7 in accordance with the present invention. Since bias power supply 5 is considered to be grounded in terms of AC, the equivalent circuit of this optical receiver is shown in FIG. 2. Since high-frequency characteristics are analyzed in the following description, interstage coupling capacitor $C_c$ 6 is omitted in FIG. 2 for simplicity.

The following explains the principle of the present invention.

Figure 3:
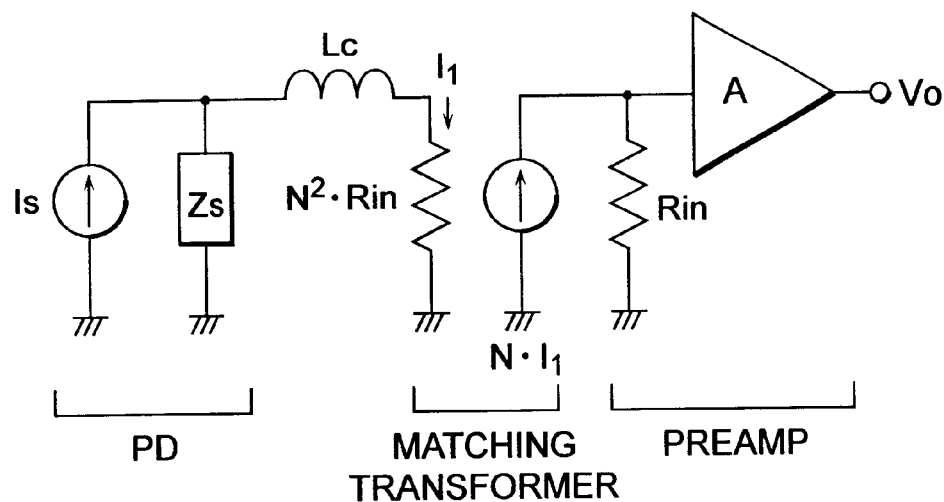
FIG. 3 is an equivalent circuit diagram simplifying FIG. 2 showing an equivalent circuit expressed by use of a signal source impedance $Z_s$ and a current source $I_s$ corresponding to an optical input.

When the signal source impedance on the PD terminal connected to the second frequency characteristic compensating coil $L_c$ is expressed as $Z_s$, the equivalent circuit diagram of FIG. 2 can be further simplified as shown in FIG. 3. Assuming the amplification degree of the preamplifier to be A, the transfer function $G(s)=V_o/I_s$ is represented by:

$$G(s) = \frac{V_O}{I_S} = \frac{A \cdot N \cdot R_{in} \cdot Z_S}{sL_c + N^2 \cdot R_{in} + Z_S} = \frac{G_0 \cdot Z_S}{sL_c + N^2 \cdot R_{in} + Z_S} \quad \text{(Expression 1)}$$

Namely, G(s) is a function of impedance $Z_s$, whereby the value of G(s) equals a saturated value $G_o=A \cdot N \cdot R_{in}$ in a low frequency region with a large $Z_s$ in which the PD can be considered to be an ideal signal source and becomes smaller as $Z_s$ decreases. In order to prevent the value of the transfer function from decreasing in the higher frequency region as well, it is necessary to compensate frequency characteristics such that $Z_s$ is not reduced in the higher frequency region.

Figure 4:
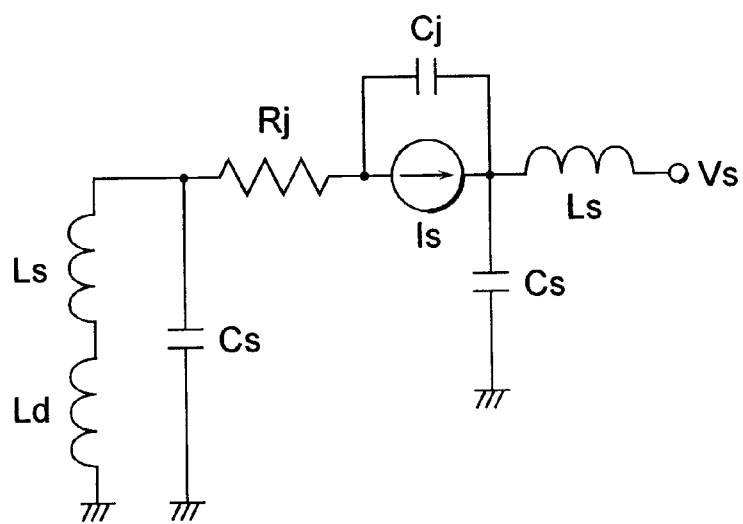
FIG. 4 is an equivalent circuit diagram of the signal source, taking into account parasitic elements.

The signal source impedance will further be studied now. FIG. 4 shows an equivalent circuit that comprises signal source impedance $Z_s$ including frequency characteristic compensating coil $L_d$ in accordance with the present invention. First, the conventional case of $L_d=0$ where no compensating coil $L_d$ is provided, i.e., where $L_d$ is short-circuited, will be studied. Assuming the output voltage of the signal source to be $V_s$, the signal source impedance $Z_s=V_s/I_s$ is expressed as:

$$Z_S = \frac{V_S}{I_S} \quad \text{(Expression 2)}$$

$$= \frac{1}{s(C_S + C_j)\left[1 + \left(R_j + \frac{sL_S}{1+s^2 \cdot L_S \cdot C_S}\right)\frac{s \cdot C_S \cdot C_j}{C_S + C_j}\right]}$$

When parasitic capacitance $C_s$, junction capacitance $C_j$, parasitic inductance $L_s$, and diffused resistance $R_j$ of the PD are assumed to be 0.5 pF, 0.5 pF, 2 nH, and 10 ohms, respectively, and contributions of the respective terms at a frequency of 1 GHz are estimated, the terms within the square brackets in the denominator of Expression 2 are approximately 1. Accordingly, the signal source impedance is expressed as a relationship that substantially depends on the parasitic capacitance and the junction capacitance alone, i.e. $Z_s=1/s/(C_s+C_j)$. When this $Z_s$ is substituted into Expression 1, the transfer function G(s) in this case is derived as:

$$G(s) = \frac{G_0}{1 + s^2 \cdot L_c \cdot (C_S + C_j) + N^2 \cdot R_{in} \cdot s(C_S + C_j)} \quad \text{(Expression 3)}$$

In the case without frequency characteristic compensating coil L, (where $L_c=0$ in expression 3, corresponding to the circuit in which there is no frequency characteristic compensation), assuming an ideal impedance-matching transformer, the cutoff frequency becomes:

$$f_C = \frac{1}{2\pi \cdot N^2 \cdot R_{in} \cdot (C_S + C_j)} \quad \text{(Expression 4)}$$

In a frequency region higher than this cutoff frequency, the transfer function, i.e. gain decreases. Substitution of the above-mentioned values as parasitic capacitance $C_s$ and junction capacitance $C_j$, and 75 ohms and 2 as $R_{in}$ and N, respectively, allows the cutoff frequency $f_c$ to be calculated as $f_c$=530 MHz.

Next, when frequency characteristic compensating coil $L_c$ is inserted, the sum of the first and second terms in the denominator of Expression 3 acts as a resonance term, whereby a resonance phenomenon occurs at $f_0=1/\{2\pi \cdot [L_c \cdot (C_s+C_j)]^{1/2}\}$. For example, the use of a coil of 70 nH as $L_c$ yields $f_0$~600 MHz and allows gain to be enhanced in the vicinity of this frequency. Here, at the frequency $f=f_0$ where the resonance is the most active, the value of transfer function is:

$$|G(f = f_0)| = \frac{f_c}{f_0} G_0 \quad \text{(Expression 5)}$$

Expression 5 indicates that when $f_0 > f_c$ the gain in a frequency higher than the cutoff frequency $f_c$ without the presence of $L_c$ or even with the presence of $L_c$ to cause a resonance phenomenon that enhances the gain cannot exceed the gain $G_0$ in the lower frequency region. Namely, it indicates that even the insertion of $L_c$ cannot compensate for decrease in the gain on the frequency region higher than $f_c$.

The case where the frequency characteristic compensating coil $L_d$ in accordance with the present invention is connected will now be studied. Namely, the case where $L_d$ has a finite value in FIG. 4 will be considered. In this case, the signal source impedance $Z_s$ is approximately represented as follows:

$$Z_S = \cfrac{1}{s \cdot (C_S + C_j) \cdot \left[1 + \cfrac{s^2 \cdot (L_S + L_d) \cdot C_S \cdot C_j}{(1 + s^2 \cdot (L_S + L_d) \cdot C_S) \cdot (C_S + C_j)}\right]} \qquad \text{(Expression 6)}$$

Here, substitution of Expression 6 into Expression 1 gives the transfer function G(s) as follows:

$$G(s) = \cfrac{(G_0)}{1 + [s \cdot N^2 \cdot R_{in} \cdot (C_S + C_j) + s^2 L_C (C_S + C_j)] \left[1 + \cfrac{s^2 (L_S + L_d) C_S \cdot C_j}{(1 + s^2 (L_S + L_d) C_S)(C_S + C_j)}\right]} \qquad \text{(Expression 7)}$$

In this case, the elements within the second set of square brackets in the denominator of Expression 7 also act as a resonance term, whereby the resonance frequency $f_1$ caused by this term is expressed as:

$$f_1 = \cfrac{1}{2\pi \sqrt{(L_S + L_d) \cdot \left(C_S + \cfrac{C_S \cdot C_j}{C_S + C_j}\right)}} \qquad \text{(Expression 8)}$$

Then, the value of transfer function at the frequency $f_1$ is $G(f=f_1)=G_0$, whereby, in the region of frequency higher than $f_c$, insertion of $L_d$ makes it possible to yield a gain at least as high as that in the lower frequency region.

Figure 5:
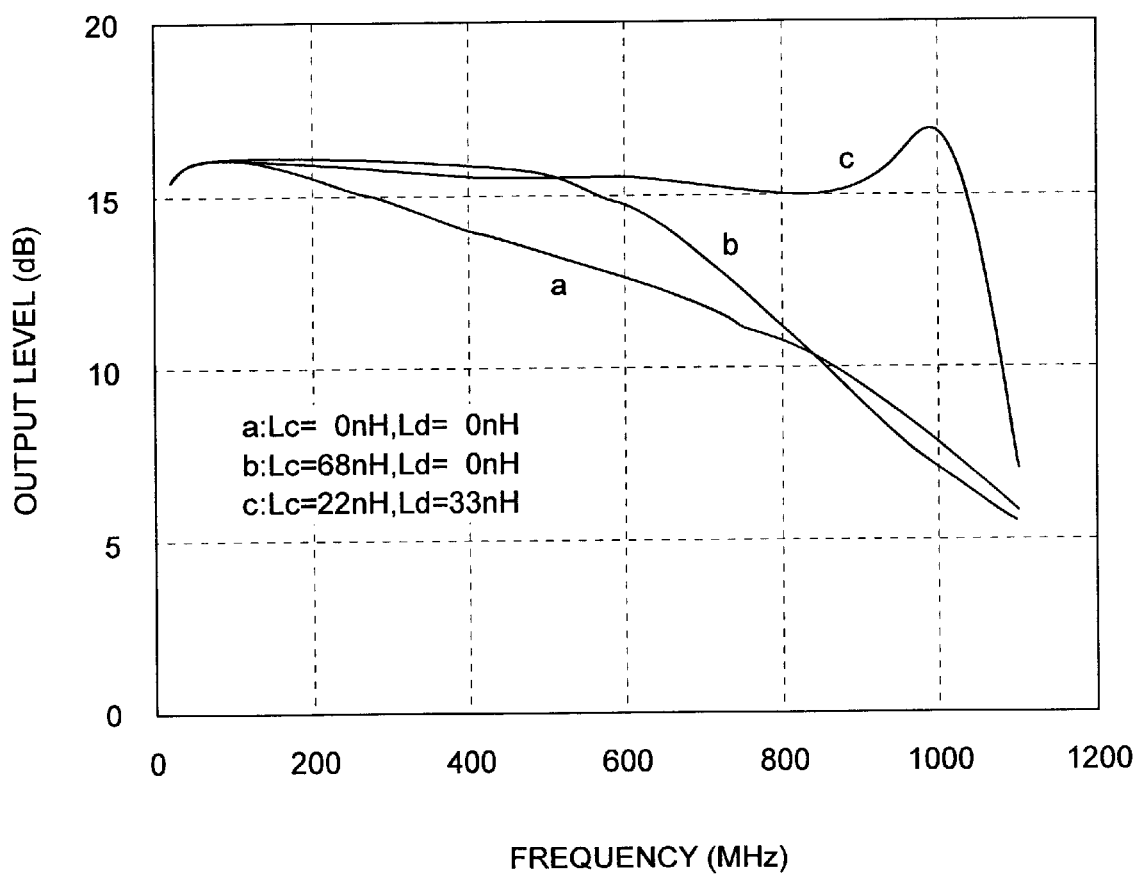
FIG. 5 is a graph for showing the effects of frequency characteristic compensation.

FIG. 5 is a graph showing frequency characteristic compensating effects in accordance with the present invention. In this graph, solid lines a, b, and c indicate, respectively, the cases where no circuit compensating element is inserted at all, where only coil $L_c$ is inserted as a compensating circuit element between the PD and the matching transformer, and where in addition to $L_c$ the compensating circuit element $L_d$ is inserted between the power supply bias terminal and one terminal of the PD. Here, 0.5 pF is used for each of the parasitic capacitance and junction capacitance, 2 nH is used for the parasitic inductance, and 10 ohms is used for the diffused resistor. The values indicated in the drawing are respectively used for the frequency characteristic correcting coils $L_c$ and $L_d$.

According to FIG. 5, in the case where there is no frequency characteristic compensation, the cutoff frequency in the higher frequency range, defined as a frequency at which the gain is reduced by 3 dB from the value in the lower frequency region, is about 550 MHz. In the case where only the frequency characteristic compensating coil $L_c$ is added, the first resonance frequency $f_0$ is estimated as 610 MHz. As shown above, however, at $f=f_0$, the output level is not restored to the level in the lower frequency region, and only partially compensates for the decrease in output level. On the other hand, FIG. 5 shows that when the compensating coil $L_d$ is added and the resonance frequency $f_1$ caused by the addition of this coil is calculated as 980 MHz, the output level is compensated up to a value greater than that in the lower frequency region.

Preferably, the magnitude of the inductance component in the first frequency compensating circuit is such that the resonance frequency determined by this inductance and the parasitic capacitance, junction capacitance, and the like of the light-receiving device is in the vicinity of the upper limit frequency of the frequency band at which the optical receiver will be used. As a consequence, the equivalent signal source impedance of the light-receiving device is enhanced, compensating for the decrease in gain of the optical receiver.

Preferably, the magnitude of the inductance component in the second frequency characteristic compensating circuit is located in a frequency region near the upper limit of the frequency band of the optical receiver, e.g. in the frequency region near the cutoff frequency if there were no frequency compensation. As a consequence, it can compensate for the output level in a frequency region lower than a frequency region where the first frequency characteristic compensating circuit can compensate for the gain, whereby a plurality of frequency characteristic compensating circuits can efficiently compensate for the gain over the whole band.

Figure 6:
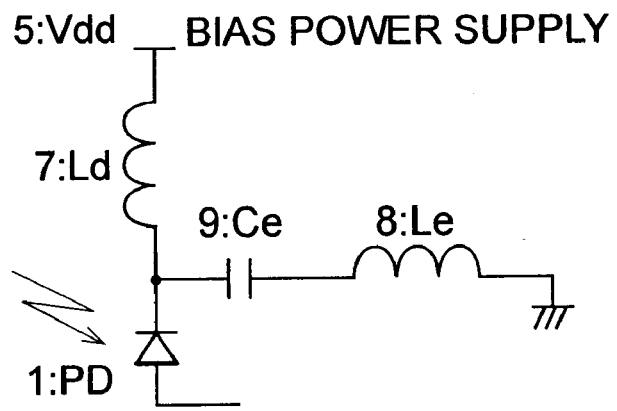
FIG. 6 is a partial circuit diagram showing another embodiment in accordance with the present invention, showing first and third frequency characteristic compensating circuits and a light-receiving device.
Figure 7:
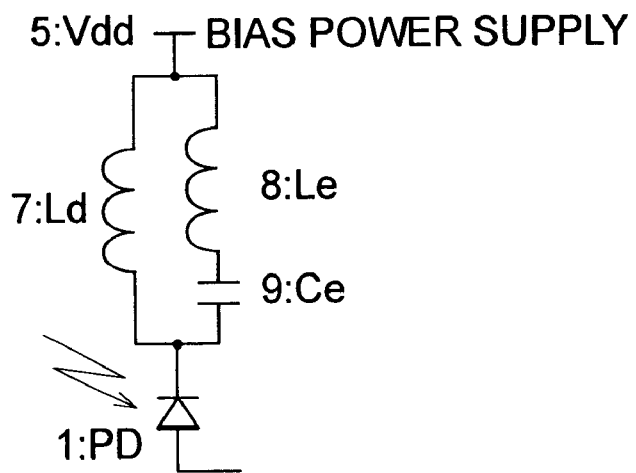
FIG. 7 is a partial circuit diagram showing still another embodiment in accordance with the present invention, showing first and third frequency characteristic compensating circuits and a light-receiving device.

The frequency characteristic compensating circuit inserted between the power supply terminal and the PD should not be restricted to those disclosed in these embodiments. For example, similar effects can be expected in a configuration employing, as a third frequency characteristic correcting circuit, a serial circuit having an inductor and a capacitor connected in parallel to frequency characteristic compensating coil $L_d$ on an equivalent circuit diagram. In practice, as shown in FIG. 6, a serial circuit having a coil $L_e$ 8 and a capacitor $C_e$ 9 may be inserted between one terminal of the PD coupled to the bias power supply terminal and the ground. Also, as shown in FIG. 7, a serial circuit having a coil $L_e$ 8 and a capacitor $C_e$ 9 may be connected in parallel to frequency characteristic compensating coil $L_d$.

In such circuits, the combined impedance Z of the first and third circuits for correcting frequency characteristics connected to the PD terminal is that of $s \cdot L_d$ and $s \cdot L_e + 1/(s \cdot C_e)$ connected in parallel, whereby $Z = s \cdot L_d \cdot [(1 + s^2 \cdot L_e \cdot C_e)/(1 + s^2 \cdot (L_d + L_e))]$. In this expression, in the low frequency region, only $L_d$ can be effective. As the frequency increases, on the other hand, Z is enhanced in a resonating fashion at $f_2 = 1 \lfloor / 2\pi \cdot ((L_d + L_e) \cdot C_e)^{1/2} \rfloor$. Consequently, when suitable values of $L_e$ and $C_e$ are selected, $L_d$ can become equivalently greater in frequencies higher than $f_1$. In order for the optical receiver to operate stably, however, it is necessary for the circuit as a whole to have no gain at any frequency between $f_2$ and $f_3 = 1/\lfloor 2\pi \cdot (L_e \cdot C_e)^{1/2} \rfloor$.

Not only the PIN photodiode, but also avalanche diode and metal-semiconductor-metal (MSM) type devices may be used as light-receiving devices, and similar effects can be expected. As the preamplifier, circuits having an input impedance of 75 ohms, of course, a 50-Ω system circuit can be used.

The foregoing embodiments explain the case where a coil $L_c$ is inserted between the PD and the matching transformer, and a coil $L_d$ is inserted between the terminal of the PD and the power supply terminal. Even if there is no coil $L_c$, the frequency characteristic compensating effects in accordance with the present invention can be demonstrated as studied above. Namely, even when $L_c = 0$ in expression 7, the resonance frequency $f_1$ indicated by expression 8 can be obtained. The value of the transfer function at this frequency $f_1$ is $G(f=f_1) = G_0$, whereby the same gain as that of the lower frequency region can also be obtained at a frequency higher than $f_c$ when $L_d$ is inserted.

INDUSTRIAL APPLICABILITY

When the frequency characteristic compensating circuit is connected between the bias terminal and the terminal of the light-receiving device in the optical receiver, the gain can be appropriately improved in the frequency region higher than the cutoff frequency on the high frequency side in the conventional circuit, without affecting its middle to low frequency characteristics. As a result, without being limited by other solutions such as improvement in the high-frequency characteristics of the light-receiving device itself, the use of a special package, or the like as in conventional cases, a circuit technique can be employed to improve the high-frequency characteristics of an optical receiver.

What is claimed is:

1. An optical receiver comprising a light-receiving device, having first and second terminals, for converting an optical input signal into an electric signal, the first terminal being coupled to a bias power supply; a preamplifier, coupled to the second terminal of said light-receiving device, for amplifying said electric signal; and an impedance-matching transformer, electrically coupled to said light-receiving device and said preamplifier, said impedance-matching transformer having a primary side impedance matching an output impedance of said light-receiving device and a secondary side impedance matching an input impedance of said preamplifier, said optical receiver further comprising a first frequency characteristic compensating circuit, said first frequency characteristic compensating circuit being coupled between said bias power supply and the first terminal of said light-receiving device.

2. An optical receiver according to claim 1, further comprising a second frequency characteristic compensating circuit, said second frequency characteristic compensating circuit being coupled between said light-receiving device and said impedance-matching transformer.

3. An optical receiver according to claim 1, wherein a junction between said first frequency characteristic compensating circuit and said light-receiving device is grounded by way of a third frequency characteristic compensating circuit.

4. An optical receiver according to claim 2, wherein a junction between said first frequency characteristic compensating circuit and said light-receiving device is grounded by way of a third frequency characteristic compensating circuit.

5. An optical receiver according to claim 3, wherein said third frequency characteristic compensating circuit comprises a serial circuit comprising a coil and a capacitor.

6. An optical receiver according to claim 4, wherein said third frequency characteristic compensating circuit comprises a serial circuit comprising a coil and a capacitor.

7. An optical receiver according to claim 1, wherein said first frequency characteristic compensating circuit comprises a coil.

8. An optical receiver according to claim 2, wherein each of said first frequency characteristic compensating circuit and said second frequency characteristic compensating circuit comprises a coil.

9. An optical receiver according to claim 3, wherein each of said first frequency characteristic compensating circuit and said second frequency characteristic compensating circuit comprises a coil.

10. An optical receiver according to claim 4 wherein each of said first frequency characteristic compensating circuit and said second frequency characteristic compensating circuit comprises a coil.

* * * * *